United States Patent
Otoguro et al.

(10) Patent No.: US 7,060,635 B2
(45) Date of Patent: Jun. 13, 2006

(54) METHOD OF MANUFACTURING SEMICONDUCTOR DEVICE AND METHOD OF FORMING PATTERN

(75) Inventors: Akihiko Otoguro, Kawasaki (JP); Satoshi Takechi, Kawasaki (JP); Takatoshi Deguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 93 days.

(21) Appl. No.: 10/603,077

(22) Filed: Jun. 25, 2003

(65) Prior Publication Data

US 2004/0033444 A1 Feb. 19, 2004

(30) Foreign Application Priority Data

Jun. 28, 2002 (JP) .......................... 2002-190666
Aug. 26, 2002 (JP) .......................... 2002-245798
Jun. 2, 2003 (JP) .......................... 2003-157397

(51) Int. Cl.
*H01L 21/31* (2006.01)

(52) U.S. Cl. ........................ 438/780; 438/781; 438/942; 438/952

(58) Field of Classification Search ................. 438/623, 438/780, 781, 942, 952
See application file for complete search history.

(56) References Cited

U.S. PATENT DOCUMENTS

| | | | |
|---|---|---|---|
| 6,268,457 B1 | | 7/2001 | Kennedy et al. |
| 6,348,404 B1 | * | 2/2002 | Tabara et al. ............... 438/636 |
| 6,352,922 B1 | * | 3/2002 | Kim ........................... 438/648 |
| 6,479,401 B1 | * | 11/2002 | Linliu et al. ................ 438/763 |
| 6,624,068 B1 | * | 9/2003 | Thakar et al. .............. 438/654 |
| 6,630,397 B1 | * | 10/2003 | Ding et al. ................. 438/636 |
| 2004/0029395 A1 | * | 2/2004 | Zhang et al. ............... 438/748 |

FOREIGN PATENT DOCUMENTS

| | | |
|---|---|---|
| JP | 60-254034 | 12/1985 |
| JP | 4-5658 | 1/1992 |
| JP | 5-265224 | 10/1993 |

OTHER PUBLICATIONS

J.M. Moran et al.; "High resolution, steep profile resist patterns"; *Journal of Vacuum Science Technology*; vol. 16; No. 6; Nov./Dec. 1979; pp. 1620–1624./Discussed in the specification.
Notification of the First Office Action dated Jun. 10, 2005.

* cited by examiner

*Primary Examiner*—Amir Zarabian
*Assistant Examiner*—Christy Novacek
(74) *Attorney, Agent, or Firm*—Westerman, Hattori, Daniels & Adrian, LLP

(57) ABSTRACT

The present invention provides a method of manufacturing a semiconductor device which includes a step of forming a laminated film for pattern formation on a substrate, in which the laminated film for pattern formation includes an innermost layer, an inner layer and a surface layer, an extinction coefficient k of the innermost layer is 0.3 or more, and an extinction coefficient k of the inner layer is 0.12 or more. It also provides a method of forming a pattern which includes a step of forming a laminated film for pattern formation on a substrate, in which the laminated film for pattern formation includes an innermost layer, an inner layer and a surface layer, an extinction coefficient k of the innermost layer is 0.3 or more, and an extinction coefficient k of the inner layer is 0.12 or more.

25 Claims, 13 Drawing Sheets

METHOD OF MANUFACTURING SEMICONDUCTOR DEVICE AND METHOD OF FORMING PATTERN

CROSS-REFERENCE TO RELATED APPLICATIONS

This application is based upon and claims the benefit of priority from the prior Japanese Patent Application No. 2002-190666 filed on Jun. 28, 2002, No. 2002-245798, filed on Aug. 26, 2002, and No. 2003-157397, filed on Jun. 2, 2003, the entire contents of which are incorporated herein by reference.

BACKGROUND OF THE INVENTION

1. Field of the Invention

The present invention relates to a method of manufacturing a semiconductor device, which is suited to the formation of wiring patterns and the like in semiconductor devices, and to a method of forming a pattern.

2. Description of the Related Art

In recent years, the trends toward making wires finer, increasing the number of layers, and the like have intensified in the manufacture of semiconductor integrated circuits in order to achieve greater integration, higher speeds, and the like. In semiconductor devices, there has been the trend toward increasing the aspect ratio of wires in order to prevent an increase in the resistance of the wires due to the wires being made to be finer. When the number of layers having wires of high aspect ratios is increased, the steps on the substrate become large. However, with a substrate having large steps, it is not possible to form a fine resist pattern.

Thus, there has been disclosed a three-layer resist process which can form a fine resist pattern on a substrate having large steps (refer to, for example, *Journal of Vacuum Science Technology*. (November/December 1979). vol. 16, no. 6. pp. 1620–1624). In this three-layer resist process, first, an innermost layer (lower layer) is formed by coating and hardening a thermosetting resin on an target to be worked formed on a substrate. The steps on the substrate are leveled by the innermost layer (lower layer). Then, an inner layer (intermediate layer) formed of Si-containing material, which exhibits oxygen plasma etching resistance, is formed on the innermost layer (lower layer). Next, a photosensitive resin is coated on this inner layer (intermediate layer) so as to form a surface layer (upper layer). The surface layer (upper layer) is patterned by being exposed, developed, and the like. Next, the inner layer (intermediate layer) is patterned by etching using the pattern of the surface layer (upper layer) as a mask. Then, the innermost layer (lower layer) is patterned by etching using the pattern of the inner layer (intermediate layer) as a mask. As a result, a three-layer resist pattern having a high aspect ratio is obtained. Then, the target to be worked on the substrate is patterned by etching using this three-layer resist pattern as a mask, and the desired wiring pattern is formed. In this three-layer resist process, patterning of a photosensitive resin layer, which serves as the surface layer (upper layer) on the inner layer (intermediate layer) formed on a relatively thick the innermost layer (lower layer), is carried out. Thus, patterning is not affected by the steps on the substrate, and it is possible to obtain a fine pattern with a high aspect ratio and no variations in dimensions.

In this conventional three-layer resist process, a silicon-containing material is used as the inner layer (intermediate layer), and generally, SOG (spin-on glass) is used (refer to, for example, Japanese Patent Application Laid-Open (JP-A) No. 04-005658). Because the SOG is transparent material, during patterning of the surface layer (upper layer), there is high reflectance of light which is irradiated from a direction of the surface layer (upper layer). A problem arises in that high-performance and accurate patterning of the surface layer cannot be carried out due to the interference of the light reflected by the innermost layer.

Moreover, there are cases in which an electron beam is used at the time of patterning the surface layer (upper layer). However, in these cases, problems arise in that the manufacturing costs are high, and the like (refer to, for example, JP-A No. 60-254034 and JP-A No. 05-265224).

On the other hand, in order to accurately transfer the resist pattern of the surface layer (upper layer) to the inner layer (intermediate layer), the inner layer (intermediate layer) must be formed as a thin layer of about 80 nm to 150 nm. In a case in which the inner layer (intermediate layer) is formed to be thick, a problem arises in that even the inner layer (intermediate layer) is affected and deteriorates when the surface layer (upper layer) is damaged and the configuration thereof deteriorates. On the other hand, when the inner layer (intermediate layer) is formed to be thin, it is easy for defects to arise at the inner layer (intermediate layer). For example, when the innermost layer (lower layer) is formed of a resin which contains an additive, a problem arises in that it is easy for pin holes to arise in the mask patterned formed by the inner layer (intermediate layer). When etching of the innermost layer (lower layer) is carried out by using a mask pattern in which pin holes have arisen, defects caused by the pin holes arise in the formed pattern of the innermost layer (lower layer), and there is the problem that it is not possible to carry out high-performance and accurate patterning.

Accordingly, a demand has been made on that a method of forming a pattern and a method of manufacturing a semiconductor device, which can conveniently and in fine accurate form a fine pattern of a high aspect ratio without such problems.

SUMMARY OF THE INVENTION

An object of the present invention is to provide a method of manufacturing a semiconductor device and a method of forming a pattern which can, conveniently, easily and highly accurately, form a fine pattern of a high aspect ratio.

A method of manufacturing a semiconductor device and a method of forming a pattern, according to a first aspect of the present invention comprises the step of forming a laminated film for pattern formation on a substrate, in which the laminated film for pattern formation includes an innermost layer (lower layer), an inner layer (intermediate layer) and a surface layer (upper layer), an extinction coefficient k of the innermost layer (lower layer) is 0.3 or more, and an extinction coefficient k of the inner layer (intermediate layer) is 0.12 or more. In the first aspect, the innermost layer (lower layer) is light absorbent, and the inner layer (intermediate layer) as well is light absorbent. Thus, reflection of the exposure light used in patterning the surface layer (upper layer) is effectively suppressed, and multiple interference of the reflected light does not occur. An increase in the dispersion of the line widths of the surface layer (upper layer) due to variations in the thickness of the inner layer (intermediate layer) is therefore suppressed. As a result, a fine pattern having a high aspect ratio is formed accurately and conveniently. Fine wires or the like can be worked by using the fine pattern, and a high-quality semiconductor device is manufactured.

A method of manufacturing a semiconductor device and a method of forming a pattern, according to a second aspect of the present invention comprises the step of forming a laminated film for pattern formation on a substrate, in which the laminated film for pattern formation includes an innermost layer (lower layer), an inner layer (intermediate layer) and a surface layer (upper layer), an extinction coefficient k of the innermost layer is less than 0.3, and an extinction coefficient k of the inner layer is 0.18 or more. In the second aspect, the innermost layer is light transmitting, and the inner layer is light absorbent and has low reflectance. Thus, reflection of the exposure light used in patterning the surface layer is effectively suppressed, and multiple interference of the reflected light does not occur. Thus, an increase in the dispersion of the line widths of the surface layer (upper layer) due to variations in the thickness of the inner layer is suppressed. As a result, a fine pattern having a high aspect ratio is formed accurately and conveniently. Fine wires or the like can be worked by using the fine pattern, and a high-quality semiconductor device is manufactured.

A method of manufacturing a semiconductor device and a method of forming a pattern, according to a third aspect of the present invention comprises the step of forming a laminated film for pattern formation on a substrate, in which the laminated film for pattern formation includes an innermost layer (lower layer), an inner layer (intermediate layer) and a surface layer (upper layer), and the inner layer comprises a polysiloxane compound expressed by the following Formula (1);

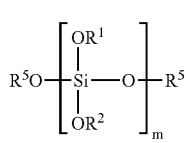

Formula (1)

wherein at least one of the substitutents, one of $R^1$ and $R^2$, expresses a light absorbent group, $R^5$ expresses a hydrogen atom or a substituent, and m expresses a degree of polymerization. In the third aspect, the inner layer is light absorbent and has low reflectance. Thus, reflection of the exposure light used in patterning the surface layer is effectively suppressed, and multiple interference of reflected light does not occur. An increase in the dispersion of the line widths of the surface layer due to variations in the thickness of the inner layer is therefore suppressed. As a result, a fine pattern having a high aspect ratio is formed accurately and conveniently. Fine wires or the like can be worked by using the fine pattern, and a high-quality semiconductor device is manufactured.

A method of manufacturing a semiconductor device and a method of forming a pattern, according to a fourth aspect of the present invention comprises the step of forming a laminated film for pattern formation on a substrate, in which the laminated film for pattern formation includes an innermost layer (lower layer), an inner layer (intermediate layer) and a surface layer (upper layer), and the innermost layer is formed by coating a composition for innermost layer formation on the substrate, and baking at 300° C. or more. In the fourth aspect, the innermost layer is formed by coating a composition for innermost layer formation on the substrate, and baking at 300° C. or more. Thus, the solvent component and the like in the composition for innermost layer formation almost completely disappear during baking, and no pin holes are formed in the inner layer at the time when the inner layer is formed on the innermost layer. As a result, a fine pattern having a high aspect ratio is formed accurately and conveniently. Fine wires or the like can be worked by using the fine pattern, and a high-quality semiconductor device is manufactured.

Figure 1A:
FIGS. 1A through 1G are views for explaining an example of steps in the method of forming a pattern of the present invention.
Figure 1B:
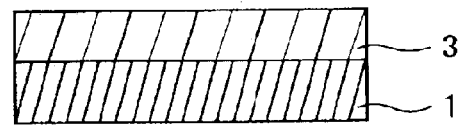
Figure 1C:
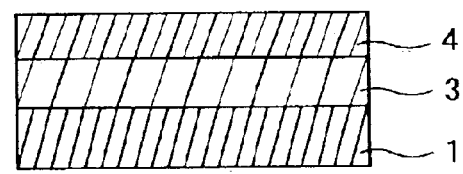
Figure 1D:
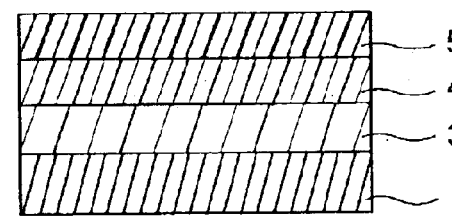

DESCRIPTION OF THE PREFERRED EMBODIMENTS (Method of Manufacturing Semiconductor Device and Method of Forming Pattern)

The method of manufacturing a semiconductor device of the present invention and the method of forming a pattern of the present invention include at least a step of forming a pattern using a laminated film for pattern formation which is formed on a substrate. The method of manufacturing a semiconductor device may further include other treatments or the like, which is suitably selected according to purposes. The laminated film for pattern formation may suitably be the following first aspect through the fourth aspect of the present invention.

In the first aspect, the extinction coefficient k of the innermost layer of the laminated film for pattern formation is 0.3 or more, and the extinction coefficient k of the inner layer is 0.12 or more.

In the second aspect, the extinction coefficient k of the innermost layer is less than 0.3, and the extinction coefficient k of the inner layer is 0.18 or more.

In the third aspect, the material for forming the inner layer is a polysiloxane compound expressed by following Formula (1), and at least one of the substituents, one of $R^1$ and $R^2$, in the Formula (1) has to be a light absorbent group.

In the fourth aspect, the innermost layer has to be formed by coating a composition for innermost layer formation on a substrate, and baking at 300° C. or more.

Laminated Film for Pattern Formation

The laminated film for pattern formation has a three-layer structure formed from a surface layer (upper layer), an inner layer (intermediate layer) and an innermost layer (lower layer).

Surface Layer (Upper Layer)

The material of the surface layer is not particularly limited provided that patterning by lithography is possible, and the material can be appropriately selected in accordance with the object. Suitable examples of the material are photosensitive resins which can be developed by exposure light, and the like. Examples of photosensitive resins are those which are generally used as resist materials. Thereamong, ArF excimer laser resists, KrF excimer laser resists, i-line resists, and the like are preferable, and ArF excimer laser resists are particularly preferable, from the standpoint of forming fine pattern.

The thickness of the surface layer is not particularly limited, and can be appropriately selected in accordance with the object. For example, a thickness of 0.05 μm to 5.0 μm is preferable, 0.1 μm to 2.0 μm is more preferable, and 0.15 μm to 1.5 μm is particularly preferable.

The method of forming the surface layer is not particularly limited, and can be appropriately selected in accordance with the object. Examples of the method of forming the surface layer include coating a composition for surface layer formation which is formed by dissolving a material for surface layer formation in a solvent or the like, onto the inner layer, and carrying out baking or the like; and the like.

Method of the coating is not particularly limited and can be appropriately selected from known methods. Examples are spin coating and the like. Method of the baking is not particularly limited and can be appropriately selected in accordance with the object.

Patterning of the surface layer can be carried out by photolithography. At this time, the light which exposes the surface layer is not particularly limited, and can be appropriately selected in accordance with the object. For example, when the material of the surface layer is an ArF excimer laser resist, ArF excimer laser light (wavelength: 193 nm) is, suitable, and when the material of the surface layer is a KrF excimer laser resists, KrF excimer laser light (wavelength: 248 nm) is suitable, and when the material of the surface layer is an i-line resist, an i-line (wavelength: 365 nm) is suitable. Further, the mask pattern used at this time is not particularly limited, and can be appropriately selected in accordance with the object. The development which is carried out after exposure is not particularly limited, and can be appropriately selected from the known methods.

Inner Layer (Intermediate Layer)

In the first aspect, the second aspect, and the fourth aspect, the material of the inner layer is not particularly limited provided that etching can be carried out, and can be appropriately selected in accordance with the object. Light absorbent materials are preferable, and polysiloxane compounds which have a light absorbent group are more preferable, and the polysiloxane compounds expressed by following Formula (1) are particularly preferable. In the third aspect, the material of the inner layer (intermediate layer) has to be a polysiloxane compound expressed by following Formula (1).

Examples of the light absorbent material are aromatic compounds, and the like.

The light absorbent group is not particularly limited provided that it can absorb light, and can be appropriately selected in accordance with the object. A light absorbent group which can absorb light having wavelength of 190 nm or more is preferable, and a light absorbent group which can absorb light having wavelength of 190 nm to 250 nm is more preferable. Examples of the light absorbent group are aromatic groups (this includes groups containing an aromatic compound), and the like. Specific examples of the light absorbent group are (4-hydroxyphenyl)methyl group, and the like.

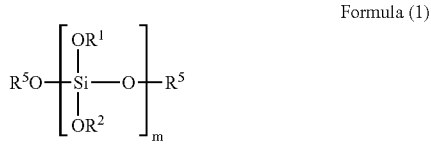

Formula (1)

In the Formula (1), $R^1$ and $R^2$ each express a hydrogen atom or a light absorbent group, and within one molecule, the entirety thereof may be a light absorbent group, or a portion thereof may be a light absorbent group. $R^5$ expresses a hydrogen atom or a substituent, and m expresses the degree of polymerization. Examples of the light absorbent group are the same as those mentioned above, and the light absorbent group is preferably selected from among aromatic groups (which includes groups containing an aromatic compound).

Note that, when the polysiloxane compound has a light absorbent group, it is reaction-inactive because the reaction region is capped by the light absorbent group. Thus, this is preferable in that the inner layer does not deteriorate and the storage stability is excellent.

Specific examples of the polysiloxane compound are not particularly limited, and can be appropriately selected in accordance with the object. Suitable examples of the polysiloxane compound are the compounds expressed by following Formula (2) and the like. Among the compounds expressed by following Formula (2), a polysilphenylene siloxane, which has a three-dimensional ball-shaped structure formed from a silphenylene siloxane nucleus and a triorganosilyl group surrounding the silphenylene siloxane nucleus, is preferable.

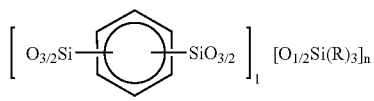

Formula (2)

In the Formula (2), "R" may be the same or different, and each expresses a hydrogen atom or a monovalent hydrocarbon group. "l" and "n" each express the degree of polymerization, and are both positive integers. Note that the hydrocarbon group is not particularly limited, and can be appropriately selected in accordance with the object. Examples are an alkyl group, a phenyl group, and the like.

The polysilphenylene siloxane can be prepared by a method which is appropriately selected in accordance with the object. For example, the method disclosed in Japanese Patent Application Laid-Open (JP-A) No. 04-181254 is preferable. Specifically, the polysilphenylene siloxane is prepared by the residual silanol group at the periphery of the silphenylene siloxane nucleus of a compound, which is synthesized by hydrolyzing the organic silicon compound expressed by following Formula (3) and dehydration condensation polymerizing the product of the hydrolysis, being substituted by a triorganosilyl group.

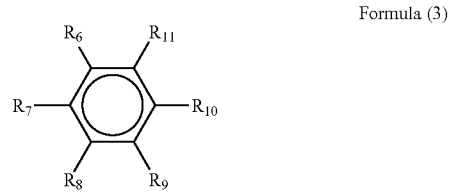

Formula (3)

In above Formula (3), $R_6$ through $R_{11}$ may be the same or different, and each expresses a hydrogen atom, a monovalent hydrocarbon group, a tricyclosilyl group, or a trialkoxysilyl group. However, among these substituents, at least two are selected from the tricyclosilyl group and the trialkoxysilyl group. Note that the hydrocarbon group is not particularly limited; and can be appropriately selected in accordance with the object. Examples of the hydrocarbon group are an alkyl group, a phenyl group, and the like.

The weight average molecular weight of the polysilphenylene siloxane is not particularly limited and can be appropriately selected in accordance with the object. For example, a weight average molecular weight of 1,000 to 5,000,000 is preferable.

In the first aspect, the extinction coefficient k of the inner layer has to be 0.07 or more, is preferably 0.07 to 0.46, is more preferably 0.07 to 0.36, is still more preferably 0.12 to 0.36, is still further more preferably 0.12 to 0.28, and is most preferably 0.16 to 0.28.

In the second aspect, the extinction coefficient k of the inner layer has to be 0.18 or more, is preferably 0.18 to 0.50, is more preferably 0.28 to 0.50, is still more preferably 0.28 to 0.45, and is most preferably 0.28 to 0.38.

In the third aspect and the fourth aspect, the extinction coefficient k can be appropriately selected in accordance with the extinction coefficient k of the innermost layer. When the extinction coefficient k of the innermost layer is 0.3 or more, the extinction coefficient k of the inner layer is preferably 0.7 or more, is more preferably 0.07 to 0.46, is still more preferably 0.07 to 0.36, is further still more preferably 0.12 to 0.36, and is most preferably 0.12 to 0.28. When the extinction coefficient k of the innermost layer is less than 0.3, the extinction coefficient k of the inner layer is preferably 0.18 or more, is more preferably 0.18 to 0.50, is still more preferably 0.28 to 0.50, is still further more preferably 0.28 to 0.45, and is most preferably 0.28 to 0.38.

Note that the extinction coefficient k of the inner layer of the laminated film for pattern formation can be measured by, for example, measuring the optical constant by a spectral ellipsometer. It also should be noted that error of the measurement is within 10%.

In each of the following cases of (1) to (3), the reflectance cannot be maintained low regardless of the thickness of the inner layer, multiple interference of exposure light due to the inner layer cannot be effectively suppressed at the time of exposing, developing and patterning the surface layer so as to form a fine pattern, and the pattern accuracy may not be improved:

(1) the extinction coefficient k of the inner layer is less than 0.07 in the first aspect;
(2) the extinction coefficient k of the inner layer is less than 0.18 in the second aspect;

(3) the extinction coefficient k of the inner layer is less than 0.07 when the extinction coefficient k of the innermost layer is 0.3 or more, or the extinction coefficient k of the inner layer is less than 0.18 when the extinction coefficient k of the innermost layer is less than 0.3, in the third and fourth aspects.

On the other hand, in each of the following cases of (1) to (3), the reflectance can be maintained low regardless of the thickness of the inner layer, multiple interference of exposure light due to the inner layer can be effectively suppressed at the time of exposing, developing and patterning the surface layer so as to form a fine pattern, and it is therefore preferable from a standpoint that the pattern accuracy can be improved:

(1) the extinction coefficient k of the inner layer is 0.12 to 0.28 in the first aspect;
(2) the extinction coefficient k of the inner layer is 0.28 to 0.45 in the second aspect;
(3) the extinction coefficient k of the inner layer is 0.12 to 0.28 when the extinction coefficient k of the innermost layer is 0.3 or more, or the extinction coefficient k of the inner layer is 0.28 to 0.45 when the extinction coefficient k of the innermost layer is less than 0.3.

The extinction coefficient k of the inner layer is obtained when a light having wavelength of 190 nm or more is irradiated to the inner layer, and preferably when a light having wavelength of 190 nm to 250 nm is irradiated to the inner layer. Note that, when the wavelength of the incident light is less than 190 nm, there are cases in which it is difficult to accurately measure the value of the extinction coefficient k of the inner layer.

The incident light preferably has wavelength of 190 nm to 250 nm. Specifically, suitable examples of the incident light are ArF excimer laser light (wavelength: 193 nm) and KrF excimer laser light (wavelength: 248 nm). Thereamong, the ArF excimer laser light (wavelength: 193 nm) is particularly preferable from the standpoint of forming a fine pattern.

The thickness of the inner layer is not particularly limited, and can be appropriately selected in accordance with the object. In the first aspect, the thickness of the inner layer is preferably 0.03 µm to 0.05 µm, 0.08 µm to 0.12 µm, or 0.13 µm to 0.15 µm. Further, in the second aspect, 0.08 µm to 0.10 µm or 0.13 µm to 0.15 µm is preferable, and 0.08 µm to 0.09 µm is more preferable. Moreover, in the third and the fourth aspects, the thickness of the inner layer can be appropriately selected in accordance with the value of the extinction coefficient k of the innermost layer. When the extinction coefficient k of the innermost layer is 0.3 or more, the thickness of the inner layer is preferably 0.03 µm to 0.05 µm, 0.08 µm to 0.12 µm, or 0.13 µm to 0.15 µm, and is more preferably 0.08 µm to 0.09 µm. When the extinction coefficient k of the innermost layer is less than 0.3, the thickness of the inner layer is preferably 0.08 µm to 0.10 µm or 0.13 µm to 0.15 µm, and is more preferably 0.08 µm to 0.09 µm.

In each of the following cases of (a) to (c), the reflectance cannot be maintained low regardless of the thickness of the inner layer, multiple interference of exposure light due to the inner layer, cannot be effectively suppressed at the time of exposing, developing and patterning the surface layer so as to form a fine pattern, and the pattern accuracy cannot be improved:

(a) the thickness of the inner layer is other than 0.03 µm to 0.05 µm, 0.08 µm to 0.12 µm, and 0.13 µm to 0.15 µm in the first aspect;

(b) the thickness of the inner layer is other than 0.08 µm to 0.10 µm and 0.13 µm to 0.15 µm in the second aspect, (c) the thickness of the inner layer is other than 0.03 µm to 0.05 µm, 0.08 µm to 0.12 µm, and 0.13 µm to 0.15 µm when the extinction coefficient k of the innermost layer is 0.3 or more in the third and fourth aspects, or the thickness of the inner layer is other than 0.08 µm to 0.10 µm and 0.13 µm to 0.15 µm when the extinction coefficient k of the innermost layer is less than 0.3 in the third and fourth aspects.

On the other hand, the thickness of the inner layer being within the aforementioned preferable numerical ranges in each of the first through fourth aspects, is preferable in that the reflectance can be maintained low regardless of the thickness of the inner layer, multiple interference of exposure light due to the inner layer can be effectively suppressed at the time of exposing, developing and patterning the surface layer so as to form a fine pattern, and the pattern accuracy can be improved.

The photoreflectance of the inner layer is preferably 2.0% or less, is more preferably 1.0% or less, and is particularly preferably 0.7% or less.

The photoreflectance of the inner layer can be measured by, for example, carrying out light intensity simulation on the basis of the optical constants of each of the layers.

The photoreflectance of the inner layer being within the aforementioned preferable numerical ranges is preferable in that the reflectance can be maintained low regardless of the thickness of the inner layer, multiple interference of exposure light due to the inner layer can be effectively suppressed at the time of exposing, developing and patterning the surface layer so as to form a fine pattern, and the pattern accuracy can be improved.

The change (%/µm) in photoreflectance with respect to the thickness of the inner layer is preferably 50 or less, and more preferably 30 or less.

The photoreflectance of the inner layer being within the aforementioned preferable numerical ranges is preferable in that the reflectance can be maintained low regardless of the thickness of the inner layer, multiple interference of exposure light due to the inner layer can be effectively suppressed at the time of exposing, developing and patterning the surface layer so as to form a fine pattern, and the pattern accuracy can be improved.

The method of forming the inner layer is not particularly limited and can be appropriately selected in accordance with the object. Examples are a method of coating, on the innermost layer, a composition for inner layer formation which is obtained by dissolving a material for inner layer formation in a solvent or the like, and baking and the like; and the like.

The method of the coating is not particularly limited, and can be appropriately selected from among known methods. Examples are spin coating and the like.

The baking temperature at the time of forming the inner layer is not particularly limited provided that the composition for inner layer formation can be hardened, and the baking temperature can be appropriately selected in accordance with the object. For example, temperature of 300° C. or more is preferable. The baking temperature of 300° C. or more is preferable in that trailing at the time of patterning can be prevented. When an organic precursor substance such as the siloxane compound or the like is used as the material of the inner layer, an inner layer which is an insoluble hardened film is formed by baking at 300° C. or more.

Note that, in the present invention, the baking temperature at the time of forming the inner layer is preferably less than or equal to the baking temperature at the time of forming the innermost layer. When the baking temperature at the time of forming the inner layer is greater than the baking temperature at the time of forming the innermost layer, there are cases in which pin holes arise in the inner layer during the baking of the inner layer, and there are cases in which a fine pattern having a high aspect ratio cannot be formed conveniently and accurately.

The patterning of the inner layer can be carried out by etching.

The gas used during etching is not particularly limited, and can be appropriately selected in accordance with the object. Suitable examples are $CF_4$ gas and the like. Further, the conditions at the time of etching, such as the temperature, the pressure and the like, are not particularly limited, and can be appropriately selected from among known conditions.

Innermost Layer (Lower Layer)

In the first through the third aspects, the material of the innermost layer (lower layer) is not particularly limited; and can be appropriately selected in accordance with the object. A material which is not etched by the etching gas used at the time of etching the inner layer, but can be etched by other etching gases, is preferable. It is more preferable to form the innermost layer (lower layer) of a material which can be etched by oxygen plasma. Specific examples of the material of the innermost layer (lower layer) are resist materials such as thermosetting resins and the like. In the fourth aspect, the material of the innermost layer has to be a thermosetting resin.

The thermosetting resin is not particularly limited, and can be appropriately selected in accordance with the object. For example, a novolak resin and the like are preferable.

The thickness of the innermost layer (lower layer) is not particularly limited and can be appropriately selected in accordance with the object. For example, 0.05 µm to 5.0 µm is preferable, 0.1 µm to 2.0 µm is more preferable, and 0.15 µm to 1.5 µm is particularly preferable.

The method of forming the innermost layer is not particularly limited and can be appropriately selected in accordance with the object. Examples are a method of coating, on the substrate, a composition for innermost layer formation which is obtained by dissolving a material for innermost layer formation in a solvent or the like, and baking and the like; or the like.

The method of coating is not particularly limited, and can be appropriately selected from among known methods. Examples are spin coating and the like.

In the first through third aspects, the baking temperature at the time of forming the innermost layer is not particularly limited provided that the composition for innermost layer formation can be hardened. The baking temperature can be appropriately selected in accordance with the object. For example, temperature of 300° C. or more are preferable, and 350° C. or more is more preferable. In the fourth aspect, the baking temperature has to be 300° C. or more, and 350° C. or more is preferable.

If the baking temperature is less than 300° C., there are cases in which pin holes arise in the inner layer (intermediate layer) at the time of forming the inner layer (intermediate layer), and there are cases in which a fine pattern having a high aspect ratio cannot be formed accurately and conveniently.

The composition for innermost layer formation may include other components which are appropriately selected in accordance with the object, for example, additives or the like.

The additive is not particularly limited, and can be appropriately selected in accordance with the object. Suitable examples are compounds which can disappear from the innermost layer (lower layer) at less than 300° C., and the like. Examples of the compounds which can disappear from the innermost layer (lower layer) at less than 300° C., are low molecular compounds, low boiling point compounds and the like. Specific examples thereof are surfactants and the like. Note that the form of the disappearance may be evaporation, volatilization, or the like.

The patterning of the innermost layer (lower layer) can be carried out by etching.

The gas used during etching is not particularly limited, and can be appropriately selected in accordance with the object. Suitable example thereof is oxygen plasma gas and the like. Further, the conditions at the time of etching, such as the temperature, the pressure and the like, are not particularly limited, and can be appropriately selected from among known conditions.

The laminated film for pattern formation is obtained by laminating the innermost layer, the inner layer, and the surface layer in this order on a substrate. For example, the laminated film for pattern formation can be obtained by the innermost layer being formed on the substrate by coating, baking, and the like, the composition for innermost layer formation, the inner layer being formed on the innermost layer by coating, baking, and the like, the composition for inner layer formation, and the surface layer being formed on the inner layer by coating, baking or the like, the composition for surface layer formation. Specifically, as shown in FIGS. 1A through 1D, the innermost layer (lower layer) 3 is formed when a composition for innermost layer formation is coated on a target to be worked on the substrate 1 (which has large steps), and the composition for innermost layer formation is hardened by baking. Thus, the steps on the substrate are leveled by the innermost layer (lower layer) 3 (refer to FIG. 1B). Note that the composition for innermost layer formation is a solution in which the material of the innermost layer is dissolved in a solvent. Next, the composition for inner layer formation is coated on the innermost layer (lower layer) 3 and hardened, such that the inner layer (intermediate layer) 4 is formed (refer to FIG. 1C). Note that the composition for inner layer formation is a solution in which the material of the inner layer is dissolved in a solvent. Thereafter, the composition for surface layer formation is coated on the inner layer (intermediate layer) 4, such that the surface layer (upper layer) 5 is formed (refer to FIG. 1D). Note that the composition for surface layer formation is a solution in which the material of the surface layer is dissolved in a solvent. In this way, the laminated film for pattern formation, which has a three-layer structure, is formed.

Figure 1E:
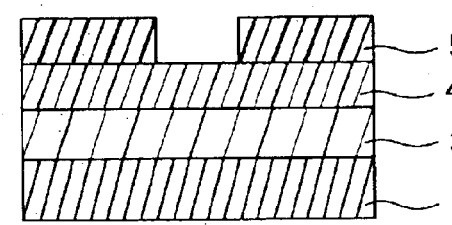
Figure 2A:
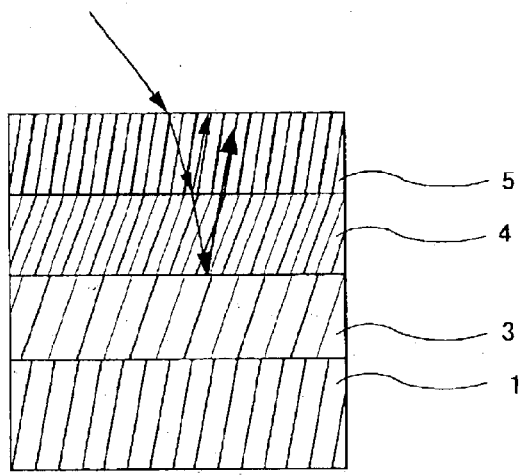
FIGS. 2A and 2B are schematic views for explaining an example of a state in which hardly any interference of reflected light, at the interface between an inner layer and an innermost layer, of exposure light incident from a surface layer is observed.
Figure 2B:
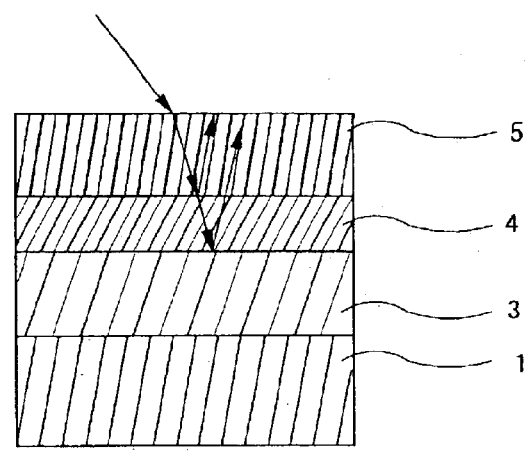

In forming a fine pattern onto the laminated film for pattern formation, for example, as shown in FIG. 1E, first, the surface layer (upper layer) is exposed, developed, and the like by using ArF excimer laser light or the like, such that a fine pattern is formed (refer to FIG. 1E). At this time, because the inner layer has low reflectance, the reflectance, at the interface between the innermost layer (lower layer) and the inner layer (intermediate layer), of the exposure light used for patterning the surface layer is effectively suppressed, and as shown in FIGS. 2A and 2B, multiple interference of the reflected light does not occur (the reflected light is neither strengthened nor weakened by the thickness of the inner layer). Thus, an increase in the dispersion of the line widths of the surface layer (upper layer) due to variations in the thickness of the inner layer (intermediate layer) is suppressed. As a result, a fine pattern having a high aspect ratio can be formed accurately and conveniently.

Figure 3:
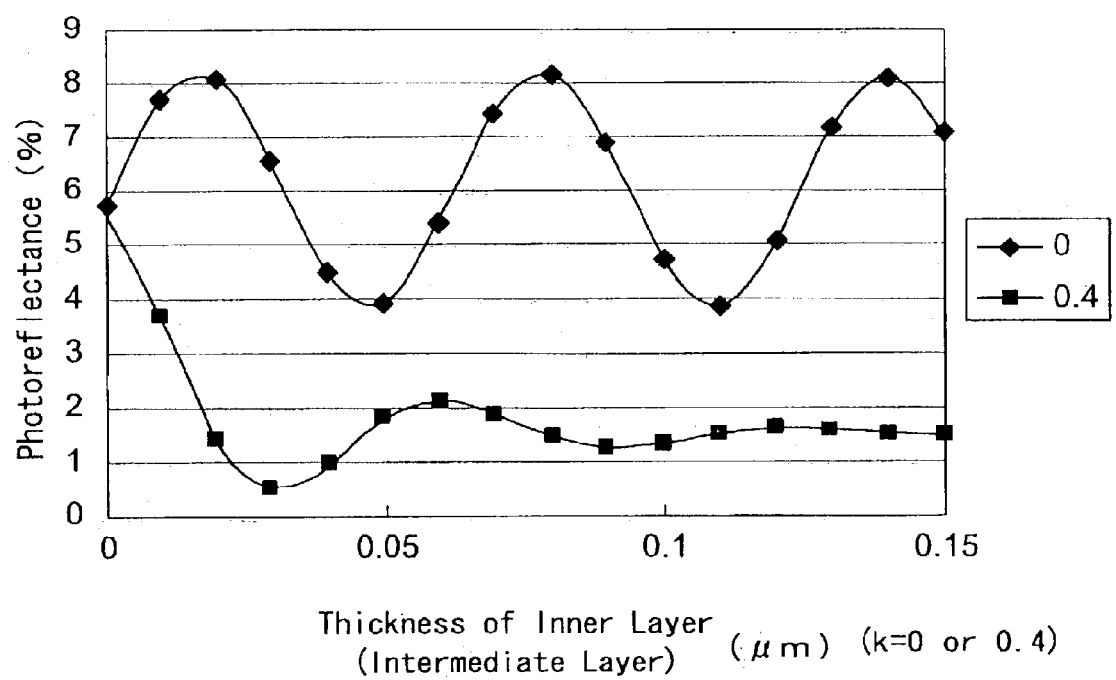
FIG. 3 is a graph showing the relationship between the thickness of the inner layer and reflectance, and showing that multiple interference is observed in case in which the reflectance is 0, as compared with a case in which the reflectance is 0.4.
Figure 4A:
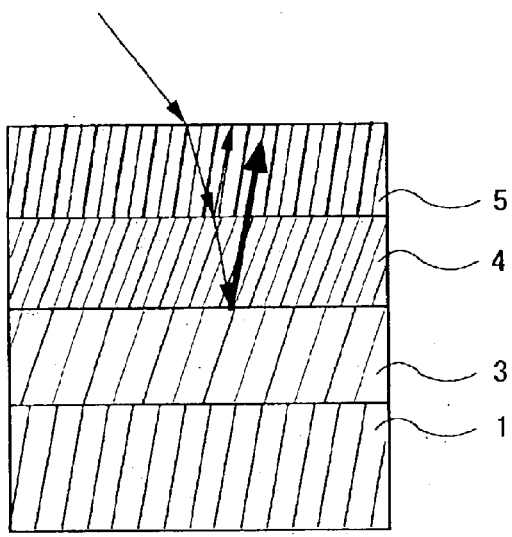
FIGS. 4A and 4B are schematic views for explaining a state in which interference of reflected light, at the interface between the inner layer and the innermost layer, of exposure light incident from the surface layer is observed.
Figure 4B:
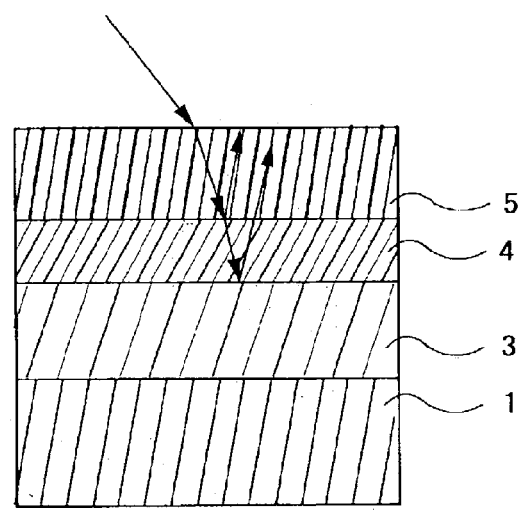

On the other hand, if the inner layer (intermediate layer) 4 does not have low reflectance as is the case in the related art, for example, when the reflectance of the inner layer (intermediate layer) 4 is 0, as shown in FIG. 3, multiple interference of the reflected light at the interface between the innermost layer (lower layer) 3 and the inner layer (intermediate layer) 4 arises, and the dispersion in the line widths of the surface layer (upper layer) 5 due to variations in the thickness of the inner layer (intermediate layer) 4 increases, as compared with a case in which the reflectance is 0.4. Note that, when multiple interference arises, as shown in FIGS. 4A and 4B, the reflected light is strengthened and weakened by the thickness of the inner layer (intermediate layer) 4.

Figure 1F:
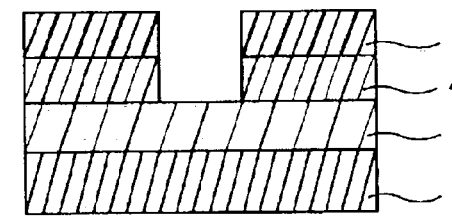
Figure 1G:
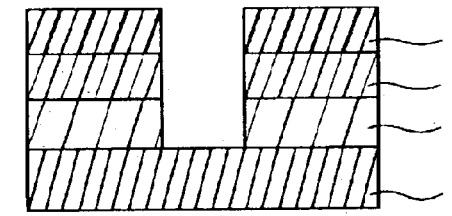

Next, as shown in FIGS. 1F and 1G, the inner layer (intermediate layer) 4 is etched by using the patterned surface layer (upper layer) 5, such that patterning of the inner layer (intermediate layer) 4 is carried out (refer to FIG. 1F). Next, the innermost layer (lower layer) 3 is etched by using the patterned inner layer (intermediate layer) 4, such that patterning of the innermost layer (lower layer) 3 is carried out (refer to FIG. 1G). As a result, a three-layer resist pattern having a high aspect ratio is obtained (refer to FIG. 1G).

In the method of manufacturing a semiconductor device and the method of forming a pattern, of the present invention, etching is then carried out by using this three-layer resist pattern as a mask, such that patterning of the target to be worked on the substrate is carried out. As a result, the desired wiring pattern is formed. The wiring pattern is not particularly limited and can be appropriately selected according to an object. Examples of the wiring pattern are a hole pattern, a damascene pattern, and the like, when the target to be worked is formed of insulating material.

In the method of manufacturing a semiconductor device of the present invention, a fine pattern having a high aspect ratio is formed, and by using this fine pattern, fine wires and the like can be manufactured, such that a semiconductor device such as a high-quality semiconductor integrated circuit (IC) or the like can be manufactured.

Hereinafter, Experiments of the present invention will be described. However, the present invention is not limited to these Experiments.

(Inner Layer Reflectance Simulation 1—Case in which Innermost Layer is Light Absorbent)

Figure 5:
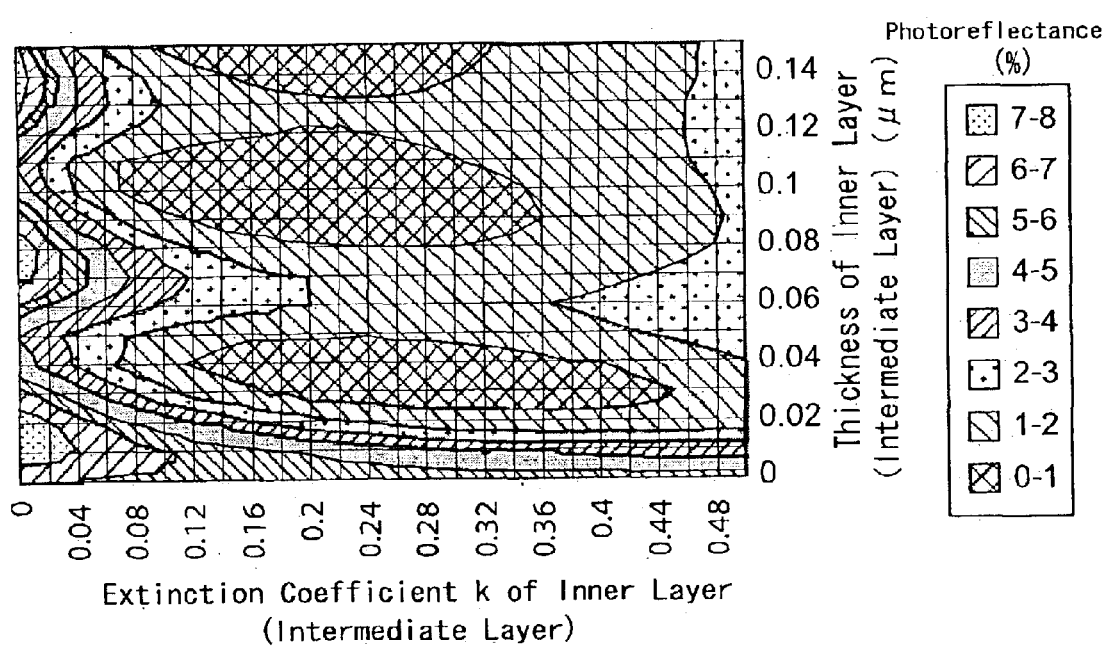
FIG. 5 is a graph showing the relationship between an extinction coefficient k and the thickness of the inner layer, in a case in which the innermost layer is light absorbent.

The resist material serving as the material of the innermost layer (lower layer) was set to have refractive index n=1.4, extinction coefficient k=0.72 (the material was light absorbent), and thickness t=0.50 (μm). The material of the inner layer (intermediate layer) was set to have refractive index n=1.57, extinction coefficient k=0.25, and thickness t=0.11 (μm). The resist material serving as the material of the surface layer (upper layer) was set to have refractive index n=1.73, extinction coefficient k=0.022, and thickness t=0.30 (μm). The reflectance was determined by simulation by using the extinction coefficient k and the thickness t of the inner layer as parameters. As can be understood from the results shown in FIG. 5, when the extinction coefficient k was 0.12 or more, a low reflectance state having a reflectance of 1% or less was obtained.

(Inner Layer Reflectance Simulation 2—Case in which Innermost Layer (Lower Layer) is Not Light Absorbent)

Figure 6:
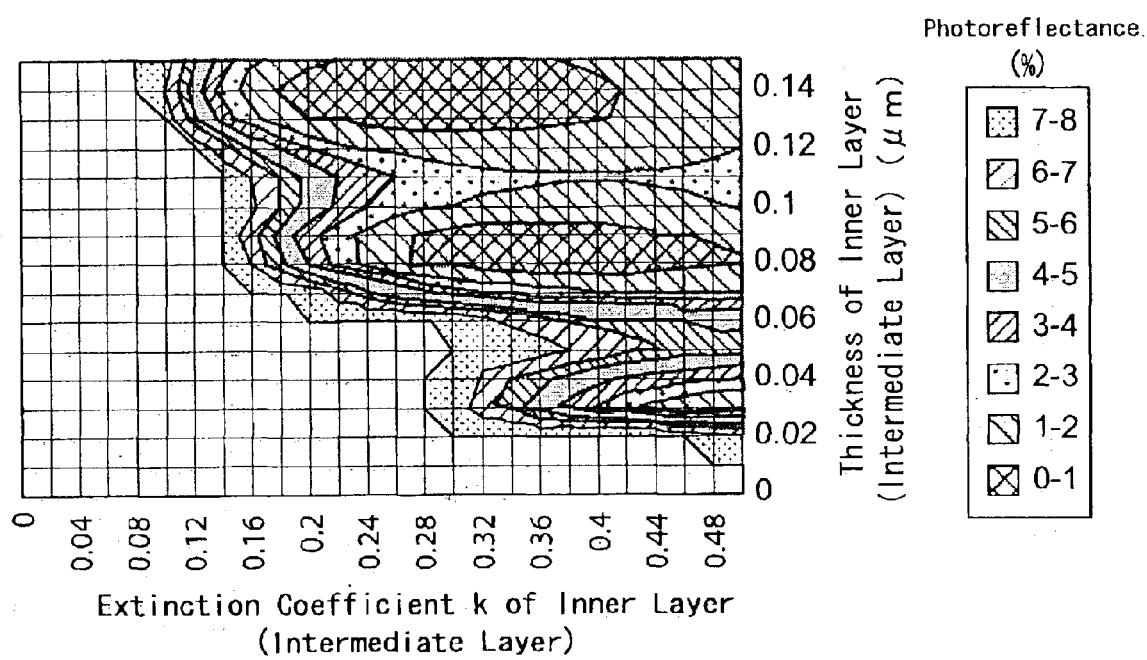
FIG. 6 is a graph showing the relationship between the extinction coefficient k and the thickness of the inner layer, in a case in which the innermost layer is not light absorbent.

The resist material serving as the material of the innermost layer (lower layer) was set to have refractive index n=1.4, extinction coefficient k=0.00 (the material was not light absorbent), and thickness t=0.50 (μm). The material of the inner layer (intermediate layer) was set to have refractive index n=1.57, extinction coefficient k=0.28, and thickness t=0.10 (μm). The resist material serving as the material of the surface layer (upper layer) was set to have refractive index n=1.73, extinction coefficient k=0.022, and thickness t=0.30 (μm). The reflectance was determined by simulation by using the extinction coefficient k and the thickness t of the inner layer as parameters. As can be understood from the results shown in FIG. 6, when the extinction coefficient k was 0.18 or more, a low reflectance state having a reflectance of 1% or less was obtained.

(Experiment 1—Pattern Formation)

Figure 7:
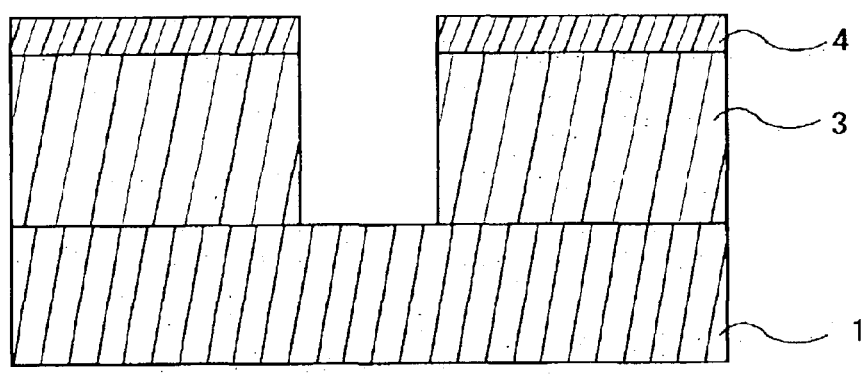
FIG. 7 is a schematic sectional view of a substrate after etching processing of the innermost layer has been completed (i.e., after the three-layer process).

Referring into FIG. 7, a resist for the innermost layer (PFI-37M, manufactured by Sumitomo Chemical Co., Ltd.) was coated to a thickness of 300 nm on a substrate 1 to be worked. Thereafter, baking was carried out for 60 seconds at 200° C., and the innermost layer (lower layer) 3 was thus formed. Note that the extinction coefficient k of the innermost layer (lower layer) 3 was 0.54. Next, a composition for inner layer formation was coated to have a thickness of 85 nm (0.085 μm) on the innermost layer (lower layer) 3. Baking was carried out for 60 seconds at 200° C., and the inner layer (intermediate layer) 4 was thus formed on the innermost layer (lower layer) 3. The composition for inner layer formation was a solution in which the polysiloxane compound expressed by following Formula (4) was dissolved in methyl amyl ketone (MAK). The extinction coefficient k of the inner layer (intermediate layer) 4 was 0.36. Note that error of the measurement of the extinction coefficient k was within 10% (this error of the measurement can be applied to the following Experiments as well).

Formula (4)

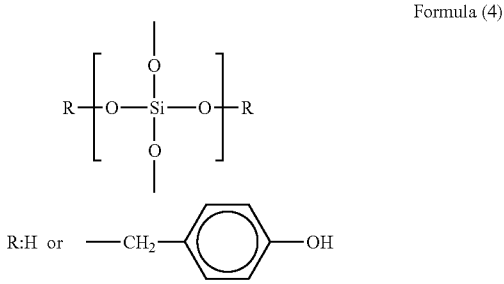

In the Experiment 1, H:Ph=6:4.

Next, a resist for the surface layer (PAR700, manufactured by Sumitomo Chemical Co., Ltd.) was coated to have a thickness of 300 nm on the inner layer (intermediate layer). Thereafter, baking was carried out for 60 seconds at 130° C., and a surface layer (upper layer) was formed on the inner layer (intermediate layer). In this way, a laminated film for pattern formation, which had a three-layer structure, was formed.

Next, exposure was carried out on the surface layer (upper layer) by using ArF excimer laser light (wavelength: 193 nm). After the exposure, baking was carried out, development was carried out, and contact holes having diameters of 150 nm were thus formed. Then, the inner layer (intermediate layer) 4 was etched by using $CF_4$ gas, such that patterning of the inner layer (intermediate layer) 4 was carried out. Thereafter, the innermost layer (lower layer) 3 was etched by using $O_2$ plasma gas such that patterning of the innermost layer (intermediate layer) 3 was carried out, and an accurate and fine pattern on the substrate 1, as shown in FIG. 7 was formed.

(Experiment 2—Pattern Formation)

An accurate and fine hole pattern such as that of Experiment 1 was formed in the same way as in Experiment 1, except that the resist for the innermost layer (PFI-37M, manufactured by Sumitomo Chemical Co., Ltd.) was replaced with adamantyl methacrylate, 4,4-diazidochalcone, and propylene glycol monomethyl acetate (PGMEA) was used as the solvent, and the extinction coefficient k of the innermost layer (lower layer) was changed from 0.36 to 0.45 (innermost Layer (lower layer) is Not Light Absorbent).

Figure 8:
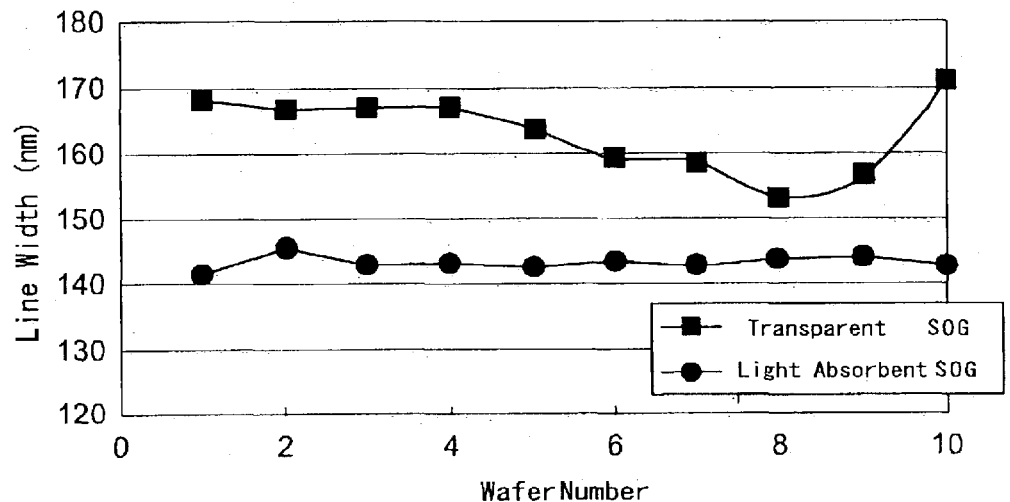
FIG. 8 is a graph of data comparing the dispersion of line widths in a case in which the inner layer has low reflectance and in a case in which the inner layer does not have low reflectance.

As shown in FIG. 8, it is clear from Experiments 1 and 2 that when the inner layer (intermediate layer) is formed by using a polyorganosiloxane compound (which has a light absorbent group) expressed by the above Formula (4), the inner layer (intermediate layer) is light absorbent and has low reflectance, and in this case, it is therefore clear that the patterning accuracy improves and there is little dispersion in thickness (the dimensional uniformity improves), as compared with a case in which the inner layer (intermediate layer) is formed by using polyorganosiloxane which does not have a light absorbent group (transparent SOG).

Figure 9:
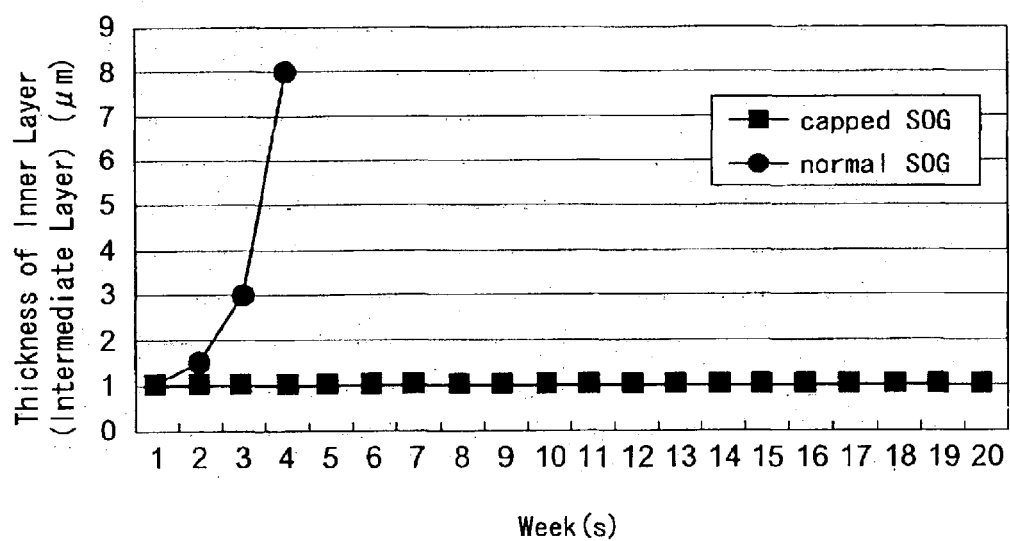
FIG. 9 is a graph of data comparing the storage stability of the inner layer in a case in which the inner layer has low reflectance and in a case in which the inner layer does not have low reflectance.

Further, as compared with polyorganosiloxane which does not have a light absorbent group (transparent SOG), a polyorganosiloxane compound (which has a light absorbent group) expressed by the above Formula (4) is reaction-inactive because the reaction region is capped by the light absorbent unit. As a result, as shown in FIG. 9, it is clear that the inner layer (intermediate layer) has excellent storage stability.

(Experiment 3)

Figure 10:
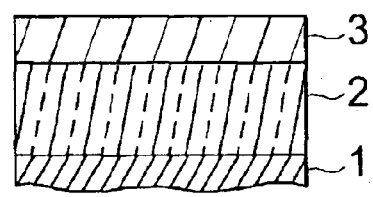
FIGS. 10A through 10F are views for explaining steps in a method of forming a pattern of Experiment 3.
Figure 10:
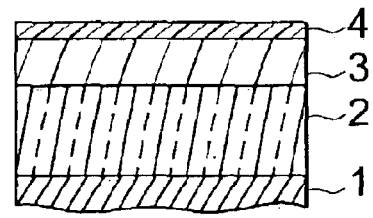
Figure 10:
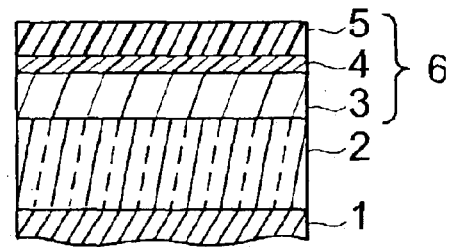
Figure 10:
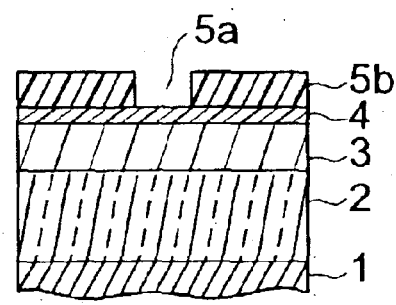
Figure 10:
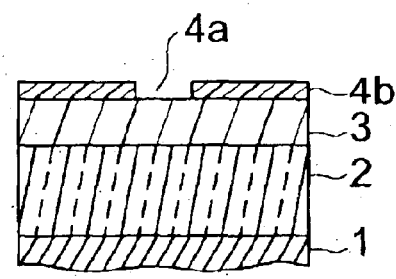
Figure 10:
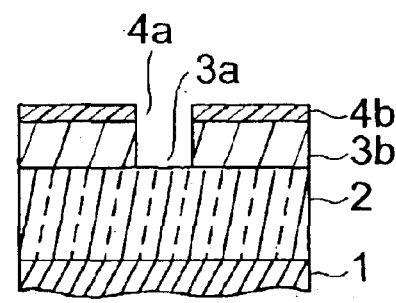

As shown in FIG. 10A, an insulating film 2, which served as an object to be worked and which was prepared by baking an organic film, was formed on an Si wafer 1 serving as a substrate. Composition A for innermost layer formation, which served as the material for an innermost layer (lower layer) 3 and which was prepared by dissolving a novolak resin in a solvent and adding a surfactant as an additive, was coated by the spin coating method on the insulating film 2. Thereafter, pre-baking was carried out for 60 seconds at 200° C. Thereafter, baking was carried out for, 60 seconds at 350° C., and the innermost layer (lower layer) 3 having a thickness of 85 nm was formed on the insulating film 2. Note that the extinction coefficient k of the innermost layer (lower layer) 3 was 0.54 (the innermost layer (lower layer) 3 was light absorbent).

Next, as shown in FIG. 10B, an organic precursor substance (siloxane A) serving as a material for inner layer formation was coated by the spin coating method on the innermost layer (lower layer) 3. Thereafter, pre-baking was carried out for 60 seconds at 200° C. Thereafter, baking was carried out for 60 seconds at 300° C., such that an inner layer (intermediate layer) 4 formed from an SOG film and having a thickness of 85 nm (0.085 µm) was formed on the innermost layer (lower layer) 3. Note that the extinction coefficient k of the inner layer was 0.36.

Next, as shown in FIG. 10C, a resist (resist AX5910, manufactured by Sumitomo Chemical Co., Ltd.) serving as a material for surface layer formation was coated by the spin coating method on the inner layer (intermediate layer) 4. Thereafter, pre-baking was carried out for 60 seconds at 100° C., and a surface layer (upper layer) 5 having a thickness of 300 nm was formed.

Next, as shown in FIG. 10D, exposure was carried out on the surface layer (upper layer) 5 by using ArF excimer laser light (wavelength: 193 nm), and post-baking processing was carried out for 60 seconds at 110° C. Thereafter, development was carried out by using 2.38% TMAH (tetramethylammonium hydroxide), such that a resist mask 5b having an opening 5a was formed.

Then, as shown in FIG. 10E, an inner layer mask pattern 4b having an opening 4a was formed by plasma etching the inner layer 4, using $CF_4$ gas and using the resist mask 5b as a mask. Thereafter, the resist mask 5b was removed. As shown in FIG. 10F, an innermost layer mask pattern 3b having an opening 3a was formed by plasma etching the innermost layer (lower layer) 4 by using $O_2$ plasma gas.

The number of cavities arising in the surface of the innermost layer mask pattern 3b was measured by an SEM (scanning electron microscope; S9200 manufactured by HITACHI Ltd.). The cavities were formed as follows: after the innermost layer mask pattern 3b was formed, when the surface of the inner layer mask pattern 4b was exposed to the $O_2$ plasma gas, the cavities were formed by isotropically etching the surface of the innermost layer mask pattern 3b directly beneath the pin holes generated in the inner layer mask pattern 4b, without the $O_2$ plasma gas etching the inner layer mask pattern 4b. Accordingly, the cavities corresponded to the pin holes, and were formed to be larger than the diameters of the pin holes. Therefore, the cavities could be easily observed by SEM observation, and the density of the pin holes which arose in the inner layer (intermediate layer) 4 was calculated on the basis of the cavities. Note that measurement was carried out by counting the number of cavities whose diameters were about 2 μm or more. As a result, the density of the pin holes of the inner layer 4 was about 100 per wafer.

(Experiment 4)

The same procedures as in Experiment 3 were carried out except that the composition A for innermost layer formation in Experiment 3 was replaced with composition B for innermost layer formation which was prepared as follows: a novolak resin was dissolved in a solvent, and a surfactant was added thereto as an additive. Also added thereto was an additive which substantially disappeared (was substantially removed) from the innermost layer (lower layer) 3 after baking and thermosetting the innermost layer 3 at a baking temperature of 300° C. or more. The density of the pin holes of the inner layer (intermediate layer) 4 was about 1000 per wafer. Note that the extinction coefficient k of the innermost layer (lower layer) 3 was 0.54 (the innermost layer was light absorbent), and the extinction coefficient k of the inner layer (intermediate layer) 4 was 0.36.

(Experiment 5)

The same procedures as in Experiment 4 were carried out except that the baking temperature of 350° C. at the time of thermosetting the innermost layer (lower layer) 3 in Experiment 4 was changed to 300° C. The density of the pin holes of the inner layer 4 was about 4000 per wafer. Note that the extinction coefficient k of the innermost layer (lower layer) 3 was 0.54 (the innermost layer was light absorbent), and the extinction coefficient k of the inner layer 4 was 0.36.

(Experiment 6)

The same procedures as in Experiment 5 were carried out except that the baking temperature of 300° C. at the time of forming the inner layer (intermediate layer) 4 in Experiment 5 was changed to 200° C. The density of the pin holes of the inner layer (intermediate layer) 4 was about 4000 per wafer. Note that the extinction coefficient k of the innermost layer (lower layer) 3 was 0.54 (the innermost layer was light absorbent), and the extinction coefficient k of the inner layer (intermediate layer) 4 was 0.36.

(Experiment 7)

The same procedures as in Experiment 6 were carried out except that the baking temperature of 300° C. at the time of thermosetting the innermost layer (lower layer) 3 in Experiment 6 was changed to 200° C. The density of the pin holes of the inner layer (intermediate layer) 4 was 10,000 or more per wafer. Note that the extinction coefficient k of the innermost layer (lower layer) 3 was 0.54 (the innermost layer (lower layer) 3 was light absorbent), and the extinction coefficient k of the inner layer (intermediate layer) 4 was 0.36.

The results of Experiments 3 through 7 are shown in Table 1.

In the Table 1, the "density of defects per wafer" refers to the density of the pin holes.

TABLE 1

| | composition | baking temperature when thermosetting innermost layer (lower layer) 3 | baking temperature when forming inner layer (intermediate layer) 4 | density of defects per wafer |
|---|---|---|---|---|
| Experiment 3 | A | 350° C. | 300° C. | about 100 |
| Experiment 4 | B | 350° C. | 300° C. | about 1,000 |
| Experiment 5 | B | 300° C. | 300° C. | about 4,000 |
| Experiment 6 | B | 300° C. | 200° C. | about 4,000 |
| Experiment 7 | B | 200° C. | 200° C. | 10,000 or more |

From the results of Experiments 3 through 6, it can be understood that, even if an additive was contained in the innermost layer (lower layer) 3, when the baking temperature at the time of thermosetting the innermost layer (lower layer) 3 was 300° C. or more, generation of pin holes of the inner layer 4 was suppressed.

From the results of Experiments 4 and 5, it can be understood that the generation of pin holes of the inner layer (intermediate layer) 4 was suppressed by making the baking temperature at the time of thermosetting the innermost layer (lower layer) 3 high.

From the results of Experiments 5 and 6, it can be understood that the generation of pin holes does not depend on the baking temperature at the time of forming the inner layer (intermediate layer) 4.

From the results of Experiments 6 and 7, it can be understood that the generation of pin holes of the inner layer (intermediate layer) 4 is accelerated when the baking (hardening) temperature of the innermost layer (lower layer) 3 is less than 300° C. Further, in the case of Experiment 7, it can be understood that, because the baking (hardening) temperature of the innermost layer 3 is too low, the inner layer mask pattern 4b deteriorates due to mixing of the innermost layer (lower layer) 3 and the inner layer (intermediate layer) 4.

(Experiment 8)

The same procedures as in Experiment 3 were carried out except that, for the material for inner layer formation, the organic precursor substance (siloxane A) was replaced by a solution in which the polysiloxane compound expressed by following Formula (4) was dissolved in methyl amyl ketone (MAK). The extinction coefficient k of the inner layer (intermediate layer) 4 was 0.36. At this time, the density of the pin holes of the inner layer (intermediate layer) 4 was about 10 or less per wafer.

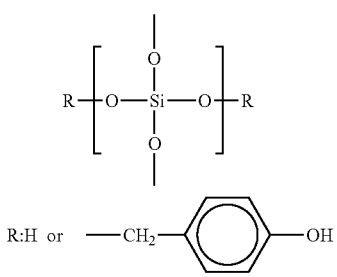

Formula (4)

In the Experiment 8, H:Ph=6:4.

(Experiment 9)

The same procedures as in Experiment 4 were carried out except that, for the material for inner layer formation, the organic precursor substance (siloxane B) in Experiment 4 was replaced with a solution in which the polysiloxane compound expressed by the above Formula (1) was dissolved in methyl amyl ketone (MAK). The extinction coefficient k of the inner layer (intermediate layer) 4 was 0.36. At this time, the density of the pin holes of the inner layer (intermediate layer) 4 was about 10 or less per wafer.

Figure 11:
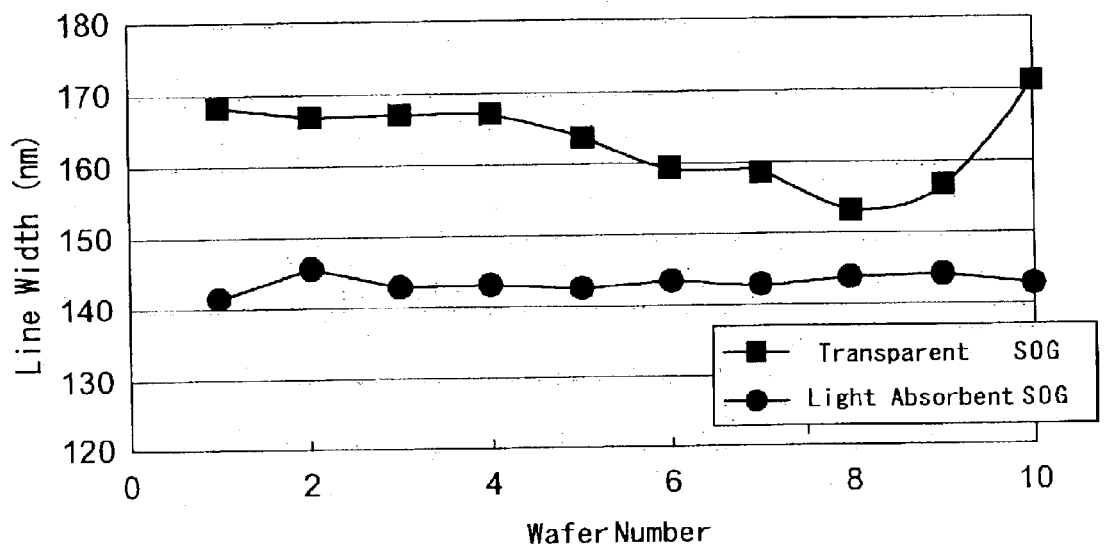
FIG. 11 is a graph of data comparing the dispersion of line widths in a case in which the inner layer has low reflectance and in a case in which the inner layer does not have low reflectance.

In accordance with Experiments 8 and 9, as shown in FIG. 11, when the inner layer (intermediate layer) 4 was formed by using the polyorganosiloxane compound (having a light absorbent group) expressed by the above Formula (4), the inner layer (intermediate layer) 4 was light absorbent and had low reflectance. It is clear that, in this case, the inner layer (intermediate layer) 4 had improved patterning accuracy and there was little dispersion in thickness (the dimensional uniformity was improved), as compared with polyorganosiloxane Which does not have a light absorbent group (transparent SOG).

Figure 12:
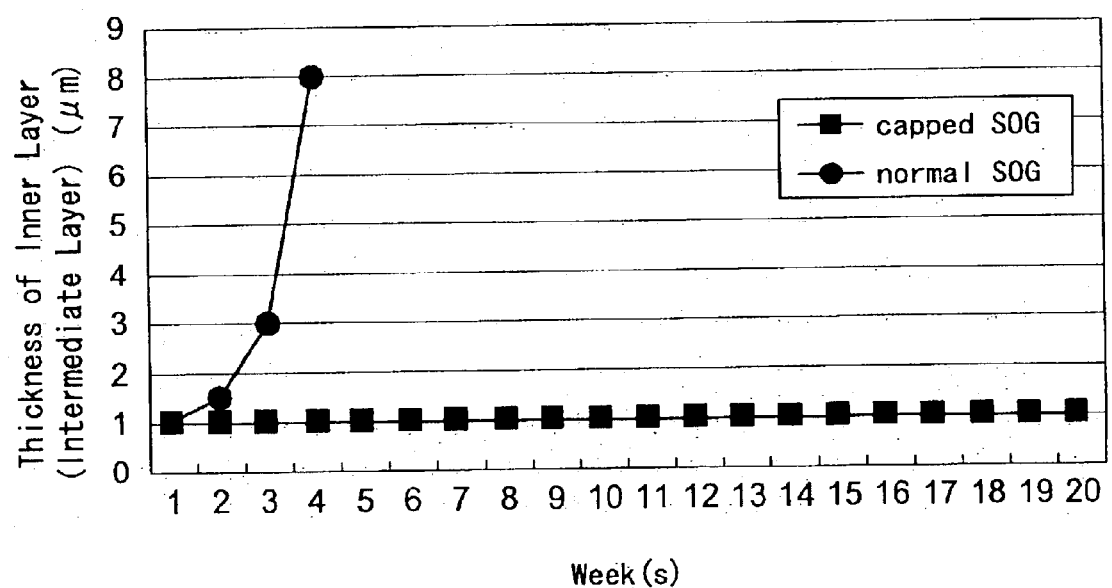
FIG. 12 is a graph of data comparing the storage stability of the inner layer in a case in which the inner layer has low reflectance and in a case in which the inner layer does not have low reflectance.

Moreover, it is clear that, as compared with polyorganosiloxane which does not have a light absorbent group (transparent SOG), the polyorganosiloxane compound (having a light absorbent group) expressed by the above Formula (4) is reaction-inactive because the reaction region is capped by the light absorbent unit, and as a result, the inner layer (intermediate layer) 4 has excellent storage stability as shown in FIG. 12.

Moreover, it can be understood that the density of the pin holes of the inner layer in Experiments 8 and 9 is maintained low by setting the baking temperature of the innermost layer to 300° C. or more.

(Manufacture of Semiconductor Device)

(Experiment 10)

Figure 13:
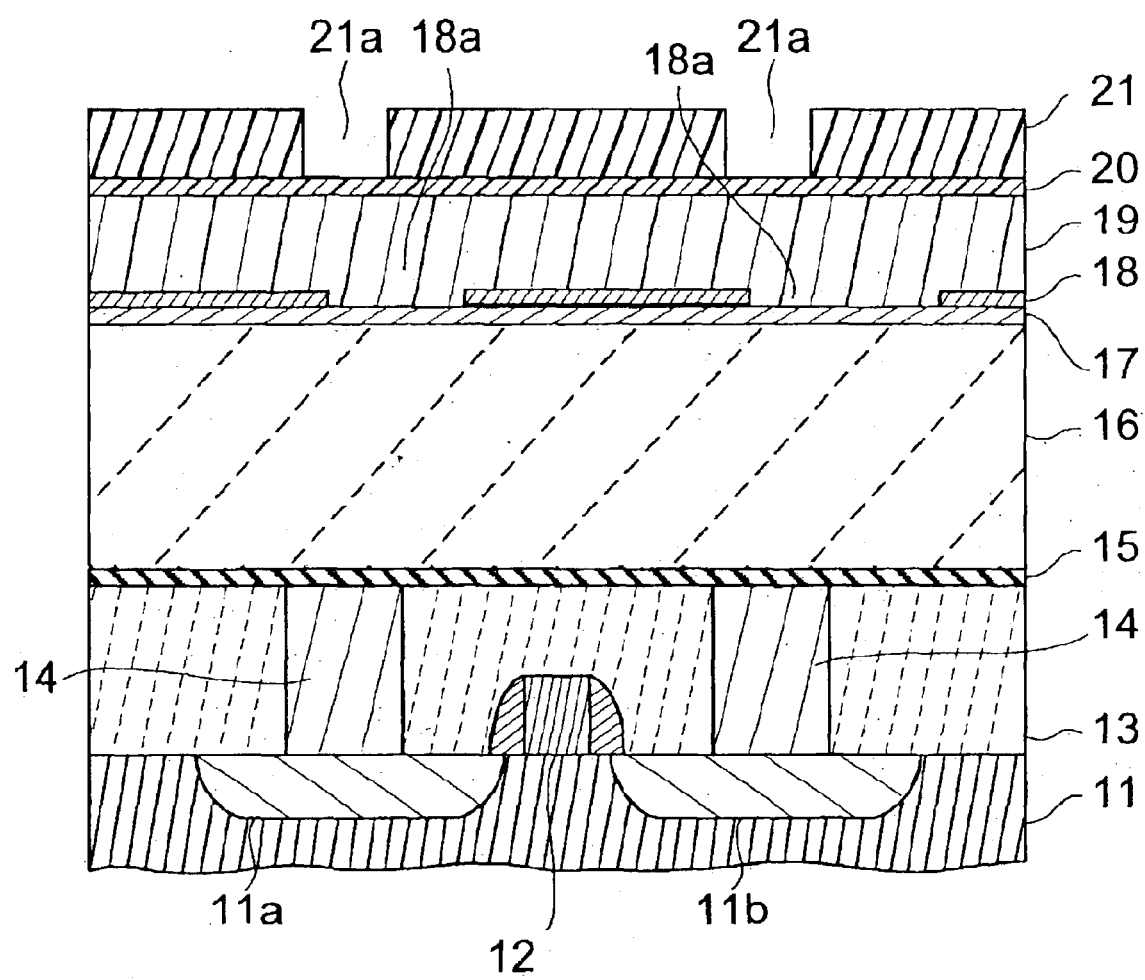
FIG. 13 is a view for explaining an example of steps of manufacturing a semiconductor device in Experiment 10.

As shown in FIG. 13, a transistor having a gate electrode 12, a source region 11a, and a drain region 11b were formed on an Si substrate 11. The surface of the transistor was coated by an insulating film 13 formed from $SiO_2$. Thereafter, contact wires 14 were formed to the source region 11a and the drain region 11b.

Then, an SiN etching supper layer 15, an interlayer insulating film 16 formed by baking an Si-containing organic film, and an SiN etching stop layer 17 were laminated in this order on the insulating film 13. An SiN mask 18, which had an opening 18a demarcating a dual damascene, shallow wiring pattern, was formed on the SiN etching stop layer 17.

Subsequently, an innermost layer (lower layer) 19, an inner layer (intermediate layer) 20, and a surface layer (upper layer: which is not shown in the figure) were laminated in this order in the same way as in Experiment 9, by using a material for innermost layer formation, a material for inner layer formation, and a material for surface layer formation, all of which were the same as those in Experiment 9. Thereafter, the surface layer (upper layer: which is not shown in the figure) was exposed and developed such that a resist mask 21, which had openings 21a demarcating dual damascene, deep via holes, was formed.

Figure 14:
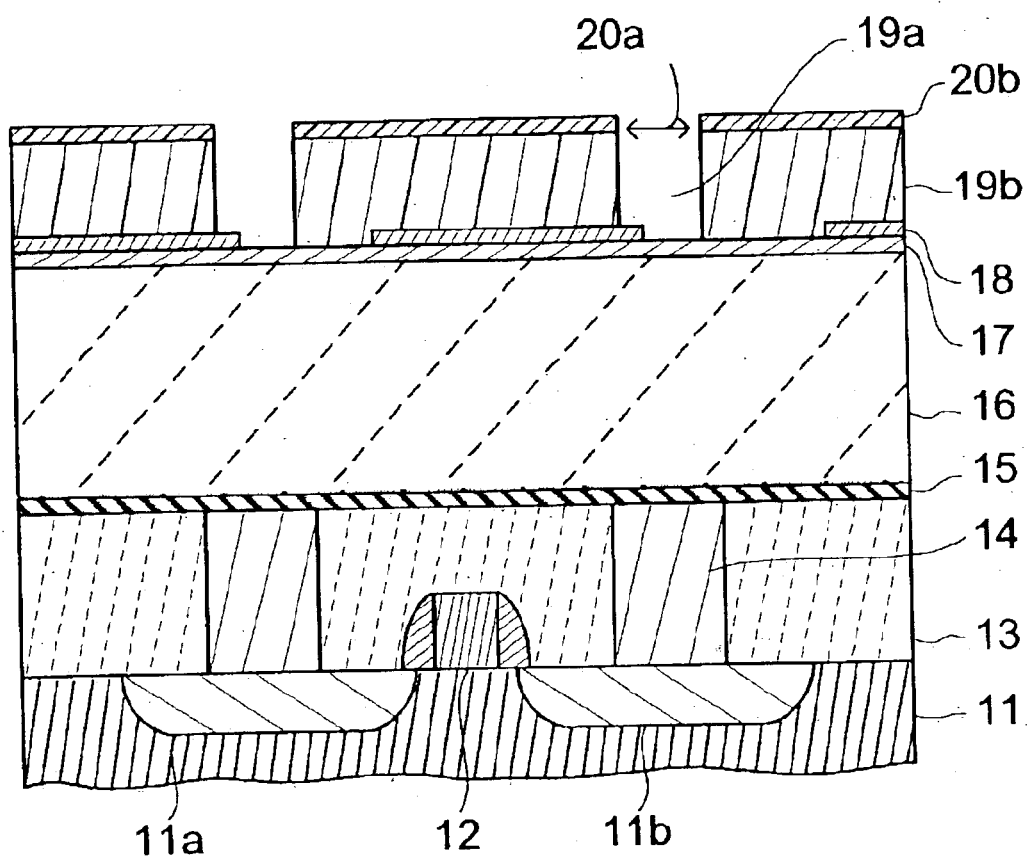
FIG. 14 is a view for explaining another example of steps of manufacturing the semiconductor device in Experiment 10.

Next, as shown in FIG. 14, the inner layer (intermediate layer) 20 was etched by using the resist mask 21 (which is not shown in the figure) as a mask, so as to form an inner layer mask pattern 20b having an opening 20a to which the opening 21a of the resist mask 21 were transferred. Thereafter, the resist mask 21 was removed.

Then, the innermost layer (lower layer) 19 was etched by using the inner layer mask pattern 20b as a mask, so as to form an innermost layer mask pattern 19b having an opening 19a to which the openings 21a of the resist mask 21 were transferred. Thereafter, the portions of the SiN mask 18 and the Sin etching stop layer 17, which were exposed at the bottom surfaces of the opening 19a of the innermost layer pattern 19b, were removed by etching.

Figure 15:
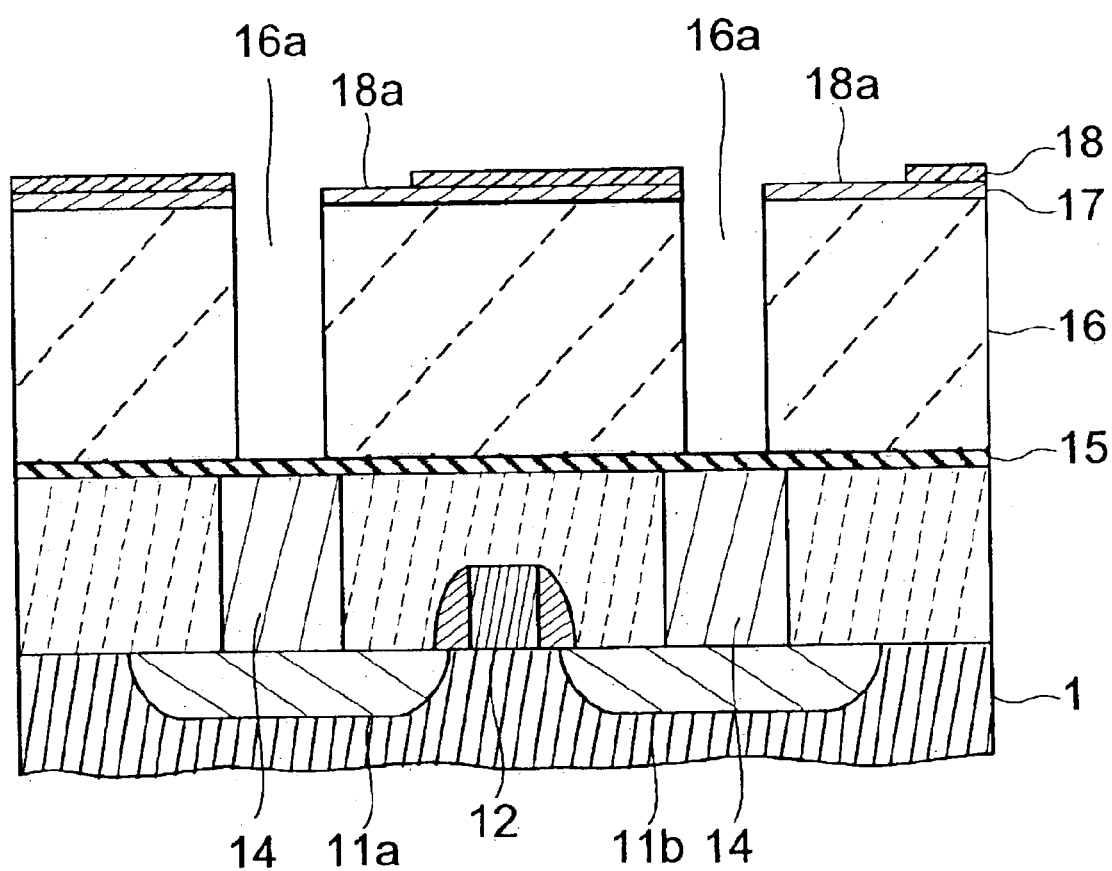
FIG. 15 is a view for explaining another example of steps of manufacturing the semiconductor device in Experiment 10.

Subsequently, the interlayer insulating film 16 was etched by using the inner layer mask pattern 20b and the innermost layer pattern 19b as masks, so as to open up, in the interlayer insulating film 16, via holes 16a which were demarcated by the openings 21a of the resist mask 21, as shown in FIG. 15.

Figure 16:
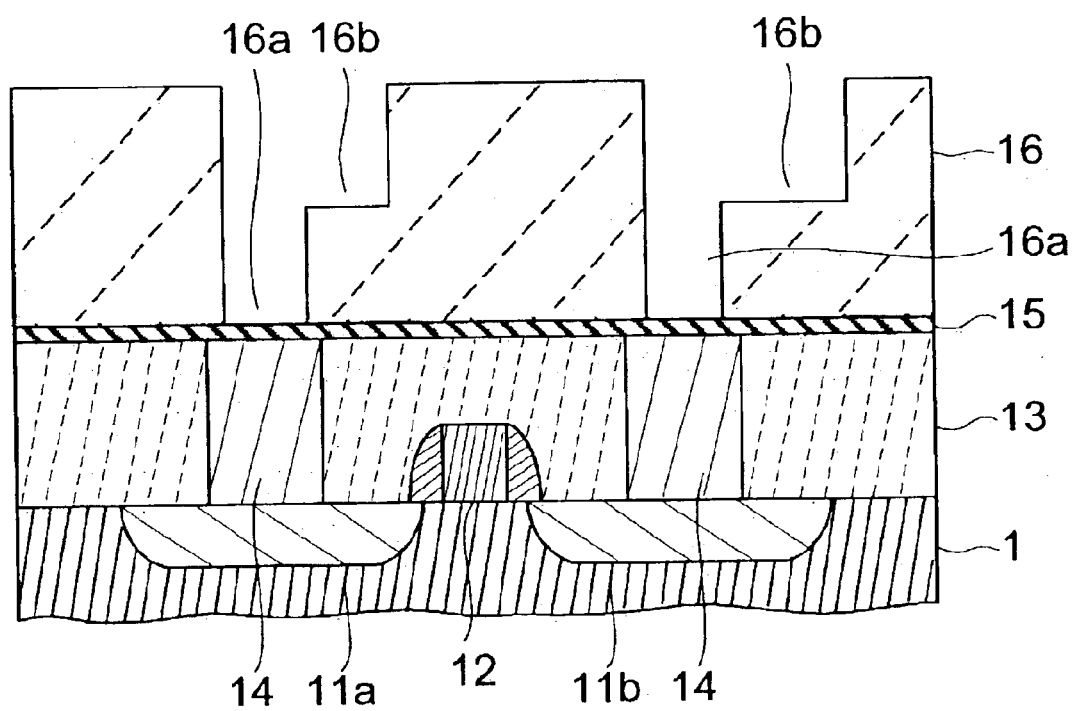
FIG. 16 is a view for explaining another example of steps of manufacturing the semiconductor device in Experiment 10.

Then, as shown in FIG. 16, by using the SiN mask 18 as a mask, the SiN etching stop layer 17 and the interlayer insulating film 16 were etched in this order. An Opening 16b, which had depths to midway through the interlayer insulating film 16, were opened up, and a wiring pattern for dual damascene formation was formed. Thereafter, the portions of the stop layer 15 exposed at the bottom surfaces of the via holes 16a were removed by etching. A groove pattern for dual damascene formation, which was formed by the contact holes 16a exposing the top surfaces of the contact wires 14 and by the openings 16b demarcating the wiring pattern, was formed.

Next, a dual damascene pattern (embedded wiring) was formed by a usual dual damascene process at the aforementioned groove pattern for dual damascene formation.

Note that the density of the pin holes of the inner layer mask pattern 20b in the dual damascene pattern forming step was about 10 or less per wafer.

In accordance with the present invention, it is possible to provide a method of forming a pattern and a method of manufacturing a semiconductor device which can, conveniently, easily and highly accurately, form a fine pattern of a high aspect ratio.

What is claimed is:

1. A method of manufacturing a semiconductor device comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, an extinction coefficient k of the innermost layer is 0.3 or more, and an extinction coefficient k of the inner layer is 0.12 or more.

2. A method of manufacturing a semiconductor device according to claim 1, wherein the extinction coefficient k of the inner layer is 0.12 to 0.28.

3. A method of manufacturing a semiconductor device according to claim 1, wherein a thickness of the inner layer is 0.08 μm to 0.12 μm.

4. A method of manufacturing a semiconductor device comprising the step of forming a laminated film for pattern formation on a substrate, wherein the laminated film for pattern formation includes an innermost layer comprising a thermosetting resin, an inner layer comprising a silicon-containing light absorbent material, and a surface layer comprising a photosensitive resin, an extinction coefficient k of the innermost layer is less than 0.3, and an extinction coefficient k of the inner layer is 0.18 or more.

5. A method of manufacturing a semiconductor device according to claim 4, wherein the extinction coefficient k of the inner layer is 0.28 to 0.45.

6. A method of manufacturing a semiconductor device according to claim 5, wherein a thickness of the inner layer is 0.08 μm to 0.10 μm.

7. A method of manufacturing a semiconductor device according to one of claims 1 and 4, wherein the extinction coefficient k of the inner layer is obtained when a light having wavelength of 190 nm to 250 nm is irradiated to the inner layer.

8. A method of manufacturing a semiconductor device according to claim 7, wherein the light having wavelength of 190 nm to 250 nm is an ArF excimer laser light.

9. A method of manufacturing a semiconductor device according to one of claims 1 and 4, wherein the surface layer comprises an AiF excimer laser resist.

10. A method of manufacturing a semiconductor device according to one of claims 1 and 4, wherein a photoreflectance of the inner layer is 2.0% or less.

11. A method of manufacturing a semiconductor device according to one of claims 1 and 4, wherein a change (%/μm) of a photoreflectance is 50 or less.

12. A method of manufacturing a semiconductor device according to one of claims 1 and 4, wherein the innermost layer is formed by coating a composition for innermost layer formation on the substrate, and baking at 300° C. or more.

13. A method of manufacturing a semiconductor device according to one of claims 1 and 4, wherein the inner layer comprises a polysiloxane compound expressed by the following Formula (1):

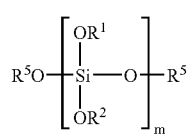

Formula (1)

wherein $R^1$ and $R^2$ each express a hydrogen atom or a light absorbent group, and in one molecule of the polysiloxane compound, an entire portion thereof may be a light absorbent group, or a portion thereof may be a light absorbent group, $R^5$ expresses a hydrogen atom or a substituent; and m expresses a degree of polymerization.

14. A method of manufacturing a semiconductor device according to claim 13, wherein the light absorbent group is selected from aromatic groups.

15. A method of manufacturing a semiconductor device comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, and the inner layer comprises a polysiloxane compound expressed by the following Formula (1):

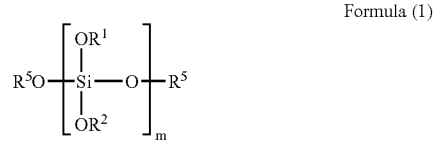

Formula (1)

wherein $R^1$ and $R^2$ each express a hydrogen atom or a light absorbent group, and in one molecule of the polysiloxane compound, an entire portion thereof may be a light absorbent group, or a portion thereof may be a light absorbent group, $R^5$ expresses a hydrogen atom or a substituent; and m expresses a degree of polymerization.

16. A method of manufacturing a semiconductor device comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, and the innermost layer is formed by coating a composition for innermost layer formation on the substrate, and baking at 300° C. or more.

17. A method of manufacturing a semiconductor device according to claim 16, wherein the inner layer is formed by coating a composition for inner layer formation on the substrate, and baking at less than 300° C.

18. A method of manufacturing a semiconductor device according to claim 16, wherein the composition for innermost layer formation contains a thermosetting resin, and the thermosetting resin is a novolak resin.

19. A method of manufacturing a semiconductor device according to claim 16, wherein the composition for innermost layer formation contains an additive, and the additive is removed from the innermost layer when the innermost layer is baked at 300° C. or more.

20. A method of manufacturing a semiconductor device according to claim 19, wherein the additive disappears from the innermost layer at less than 300° C.

21. A method of manufacturing a semiconductor device according to claim 19, wherein the additive is at least one selected from surfactants.

22. A method of forming a pattern comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, an extinction coefficient k of the innermost layer is 0.3 or more, and an extinction coefficient k of the inner layer is 0.12 or more.

23. A method of forming a pattern comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, an extinction coefficient k of the innermost layer is less than 0.3, and an extinction coefficient of the inner layer is 0.18 or more.

24. A method of forming a pattern comprising the step of forming laminated film for pattern formation on a substrate, wherein the laminated film for pattern formation includes an innermost layer comprising a thermosetting resin, an inner layer comprising a silicone-containing light absorbent material and a surface layer comprising a photosensitive resin, and the inner layer comprises a polysiloxane compound expressed by the following Formula (1):

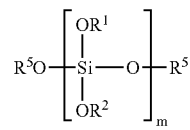

Formula (1)

wherein $R^1$ and $R^2$ each express a hydrogen atom or a light absorbent group, and in one molecule, an entire portion thereof may be a light absorbent group, or a portion thereof may be a light absorbent group, $R^5$ expresses a hydrogen atom or a substituent; and m expresses a degree of polymerization.

25. A method of forming a pattern comprising the step of forming a laminated film for pattern formation on a substrate, wherein the laminated film for pattern formation includes an innermost layer comprising a thermosetting resin, an inner layer comprising a silicon-containing light absorbent material and a surface layer comprising a photosensitive resin, and the innermost layer is formed by coating a composition for innermost layer formation on the substrate, and baking at 300° C. or more.

* * * * *